(12) United States Patent
Sentoku et al.

(10) Patent No.: US 6,992,780 B2
(45) Date of Patent: Jan. 31, 2006

(54) POSITION DETECTING METHOD AND APPARATUS, EXPOSURE APPARATUS AND DEVICE MANUFACTURING METHOD

(75) Inventors: Koichi Sentoku, Tochigi (JP); Hideki Ina, Kanagawa (JP); Takehiko Suzuki, Saitama (JP); Satoru Oishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

(21) Appl. No.: 10/150,154

(22) Filed: May 20, 2002

(65) Prior Publication Data

US 2002/0176096 A1  Nov. 28, 2002

(30) Foreign Application Priority Data

May 22, 2001  (JP) ............................. 2001-153125

(51) Int. Cl.
 G01B 11/14 (2006.01)
 G03B 27/42 (2006.01)
 G01N 21/86 (2006.01)

(52) U.S. Cl. ............... 356/620; 356/622; 356/400; 355/53; 250/548; 382/294

(58) Field of Classification Search ........ 356/603–622, 356/399–401; 355/67, 73, 77, 52–55, 43; 250/559.3, 201.2, 548, 492.2, 492.22, 599.3; 382/294, 144
See application file for complete search history.

(56) References Cited

U.S. PATENT DOCUMENTS 4,635,373 A   1/1987  Miyazaki et al. ......... 33/180 R
4,669,883 A   6/1987  Ina et al. ................... 356/401
4,794,426 A * 12/1988  Nishi .......................... 355/43
4,861,162 A   8/1989  Ina ............................. 356/401
4,870,452 A   9/1989  Tanimoto et al. ............ 355/53
4,883,359 A   11/1989  Ina et al. ................... 356/401
4,901,109 A   2/1990  Mitome et al. ............... 355/68
5,053,628 A   10/1991  Yamamoto et al. ......... 250/557
5,137,363 A * 8/1992  Kosugi et al. .............. 356/401
5,166,754 A * 11/1992  Suzuki et al. ............... 356/401
5,227,838 A * 7/1993  Nakanishi et al. ........... 355/53
5,323,207 A   6/1994  Ina ............................... 355/53
5,506,684 A * 4/1996  Ota et al. ................... 356/401
5,648,854 A   7/1997  McCoy et al. .............. 356/399
5,751,404 A * 5/1998  Murakami et al. ........... 355/53
5,781,277 A * 7/1998  Iwamoto ...................... 355/53
5,812,271 A * 9/1998  Kim ........................... 356/401
5,995,199 A * 11/1999  Shinozaki et al. ............ 355/53
6,118,516 A * 9/2000  Irie et al. ...................... 355/53
6,124,922 A   9/2000  Sentoku ....................... 355/53
6,151,120 A   11/2000  Matsumoto et al. ......... 356/399

(Continued)

FOREIGN PATENT DOCUMENTS

JP   61-263127   11/1986

(Continued)

*Primary Examiner*—Gregory J. Toatley, Jr.
*Assistant Examiner*—Sang H. Nguyen
(74) *Attorney, Agent, or Firm*—Fitzpatrick, Cella, Harper & Scinto

(57) ABSTRACT

A method of detecting relative position of a reflecting-type reticle and a substrate with the reticle having an alignment mark thereon. The method includes a holding step of holding the reticle on a reticle stage which has a reference mark, and a detection step of detecting position of the alignment mark on the reticle based on alignment light reflected from the alignment mark and detecting relative position between the reference mark on the reticle stage and the alignment mark.

14 Claims, 12 Drawing Sheets

U.S. PATENT DOCUMENTS

| | | | | |
|---|---|---|---|---|
| 6,271,910 B1 * | 8/2001 | Uzawa | .......... | 355/55 |
| 6,304,319 B1 * | 10/2001 | Mizutani | .......... | 355/69 |
| 6,307,616 B1 * | 10/2001 | Taji et al. | .......... | 355/53 |
| 6,335,537 B1 * | 1/2002 | Takahashi | .......... | 250/548 |
| 6,384,898 B1 * | 5/2002 | Inoue et al. | .......... | 355/53 |
| 6,433,351 B1 * | 8/2002 | Yonekawa | .......... | 250/559.3 |
| 6,483,571 B1 * | 11/2002 | Shiraishi | .......... | 355/53 |
| 6,525,817 B1 * | 2/2003 | Taniguchi et al. | .......... | 356/399 |
| 6,532,056 B2 * | 3/2003 | Osakabe et al. | .......... | 355/53 |
| 6,710,850 B2 * | 3/2004 | Yamaguchi et al. | .......... | 355/53 |
| 6,714,691 B2 * | 3/2004 | Outsuka | .......... | 382/294 |
| 6,785,583 B2 | 8/2004 | Oishi et al. | .......... | 700/108 |
| 6,813,002 B2 * | 11/2004 | Ota | .......... | 355/55 |
| 6,822,727 B2 * | 11/2004 | Shima | .......... | 355/53 |

FOREIGN PATENT DOCUMENTS

JP         06324472 A    * 11/1994

* cited by examiner

POSITION DETECTING METHOD AND APPARATUS, EXPOSURE APPARATUS AND DEVICE MANUFACTURING METHOD

FIELD OF THE INVENTION

This invention relates to a position detecting method and apparatus in an exposure apparatus for transferring very fine circuit patterns.

BACKGROUND OF THE INVENTION

Demagnifying projection exposure using ultraviolet light is used in lithography for manufacturing extremely fine semiconductor devices such as semiconductor memories and logic circuits.

The smallest dimension of a pattern that can be transferred by demagnifying projection exposure is proportional to the wavelength of light used in transfer and inversely proportional to the numerical aperture (NA) of the projection optical system. This means that it is necessary to shorten the wavelength of the light used to project extremely fine circuit patterns. For this reason, the wavelength of ultraviolet light used in pattern transfer has become increasingly shorter, e.g., 365 nm in mercury-vapor lamps, 248 nm in KrF excimer As semiconductor devices are becoming smaller and smaller at an increasing rate, there is a limit on what lithography using ultraviolet light can accomplish. Accordingly, in order to burn in an extremely fine circuit pattern of less than 0.1 $\mu$m in an efficient manner, a demagnifying projection exposure apparatus using extreme ultraviolet light (EUV light) of a shorter wavelength, on the order of 10 to 15 nm, has been developed.

Since absorption by the material used is pronounced in the region of EUV light, a lens-based optical system that utilizes the refraction of light, as in the case of visible or ultraviolet light, is impractical. An exposure apparatus that employs EUV light, therefore, uses a reflection optical system. In such a case, use is made of a reflecting-type reticle in which the pattern to be transferred is formed on a mirror using an absorbing body.

A multilayer mirror and an oblique-incidence total-reflection mirror are examples of reflecting-type optical elements for constructing an exposure apparatus that relies upon EUV light. In the EUV region, the real part of the index of refraction is slightly smaller than unity and, as a result, total reflection occurs if use is made of oblique incidence in which the EUV light just barely impinges upon the mirror surface. Usually, a high reflectivity of 20 or 30% or more is obtained by oblique incidence of within several degrees measured from the surface. However, because such oblique incidence diminishes the degree of freedom in terms of optical design, it is difficult to use an oblique-incidence total-reflection mirror in a projection optical system.

A multilayer mirror obtained by building up alternating layers of two types of substances having different optical constants is used as a mirror for EUV light employed at an angle of incidence close to that of direct incidence. For example, molybdenum and silicon are formed in alternating layers on the surface of a glass substrate polished to have a highly precise surface shape. The layer thicknesses of the molybdenum and silicon are, e.g., 0.2 nm and 0.5 nm, respectively, and the number of layers is 20 each. The thickness of two layers of the different substances is referred to as the "film cycle". In the above example, the film cycle is 0.2 nm+0.5 nm=0.7 nm.

When EUV light impinges upon such a multilayer mirror, EUV light of a specific wavelength is reflected. Only EUV light of a narrow bandwidth centered on a wavelength $\lambda$ that satisfies the relationship of Bragg's equation $$2 \times d \times \sin\theta = \lambda$$

where $\lambda$ represents the wavelength of the EUV light and d the film cycle, will be reflected efficiently. The bandwidth in this case is 0.6 to 1 nm.

The reflectivity of the reflected EUV light is 0.7 at most, and the unreflected EUV light is absorbed in the multilayer films or in the substrate. Most of this energy is given off as heat.

Since a multilayer mirror exhibits more loss of light than a mirror for visible light, it is necessary to hold the number of mirrors to the minimum. In order to realize a broad exposure area using a small number of mirrors, use is made of a method (scanning exposure) in which a large area is transferred by causing a reticle and a wafer to perform scanning using fine arcuate areas (ring fields) spaced apart from the optical axis at fixed distances.

FIG. 5 is a schematic view illustrating a demagnifying projection exposure apparatus that employs EUV light according to an example of the prior art. This apparatus includes an EUV light source, an illuminating optical system, a reflecting-type reticle, a projection optical system, a reticle stage, a wafer stage, an alignment optical system and a vacuum system.

By way of example, a laser plasma light source is used as the EUV light source. In the example shown in FIG. 5, a target material (supplied from a target supply unit 502) placed in a vacuum vessel 501 is irradiated with pulsed laser light (laser light that is produced by an excitation pulse laser 503 and supplied via a condensing lens 504), a high-temperature plasma is produced and EUV light having a wavelength of, say, 13 nm that emanates from the plasma is utilized as the EUV light source. A thin film of metal, an inert gas or a droplet is used as the target material, which is fed into the vacuum vessel 501 by means such as a gas jet (the target supply unit 502). In order to increase the average intensity of the EUV light emitted, the pulsed laser should have a high repetition frequency and the apparatus should be operated at a repetition frequency of several kilohertz.

The illuminating optical system that introduces the light from the EUV light source to a reticle 550 comprises a plurality of multilayer mirrors or a plurality of oblique-incidence mirrors and an optical integrator, etc. A condensing mirror (first mirror 506 of the illuminating system) constituting the first stage functions to collect EUV light emitted from the laser plasma substantially isotropically. An optical integrator 507 functions to illuminate the reticle uniformly using a prescribed numerical aperture. An aperture (field-angle limiting aperture 510) for limiting to a circular arc the area of the reticle surface that is illuminated is provided at a conjugate point with respect to the reticle disposed in the illuminating optical system.

Reflected light from the optical integrator 507 is reflected by a second mirror 508 of the illuminating system, passes through the field-angle limiting aperture 510 and is reflected again by a third mirror 509 of the optical system, thereby arriving at the reticle 550.

The projection optical system uses a plurality of mirrors (first through fourth mirrors 511 to 514). Though using a small number of mirrors allows EUV light to be utilized very efficiently, this makes it difficult to correct for aberration. The number of mirrors needed to correct for aberration is four to six. The shape of each of the reflecting surfaces of the mirrors is convex or concave spherical, or convex or concave aspherical. The numerical aperture NA is 0.1 to 0.3.

To fabricate the mirror, use is made of a substrate consisting of a material, such as glass, having a low coefficient of expansion or silicon carbide, that exhibits a high rigidity and hardness and a small coefficient of expansion, the substrate is formed to have a reflecting surface of a predetermined shape by grinding and polishing, and multilayer films such as molybdenum and silicon are formed on the reflecting surface. In a case wherein the angle of incidence is not constant owing to the location of the layer in the mirror surface, the wavelength of the EUV light, the reflectivity of which rises depending upon the location, shifts if use is made of multilayer films having a fixed film cycle, as is evident from Bragg's equation cited above. Accordingly, it is required that a film-cycle distribution be provided in such a manner that EUV light of the same wavelength will be reflected efficiently within the mirror surface.

A reticle stage 552 and a wafer stage 562 have a mechanism in which scanning is performed synchronously at a speed ratio proportional to the reducing magnification. Let X represent the scanning direction in the plane of the reticle 550 or wafer 560, Y the direction perpendicular to the X direction, and Z the direction perpendicular to the plane of the reticle 550 or wafer 560.

The reticle 550 is held by a reticle chuck 551 on the reticle stage 552. The reticle stage 552 has a mechanism for high-speed movement in the X direction. Further, the reticle stage 552 has a fine-movement mechanism for fine movement in the X, Y and Z directions and for fine rotation about these axes, thus making it possible to position the reticle 550. The position and attitude of the reticle stage 552 are measured by laser interferometers (not shown) and are controlled based upon the results of measurement.

The positional relationship between the position of the reticle 550 and the optical axis of the projection optical system and the positional relationship between the position of the wafer 560 and the optical axis of the projection optical system are measured by an alignment detection mechanism that includes alignment detecting optical systems 553, 563, and the positions and angles to the reticle stage 552 and wafer stage 562 are set in such a manner that the projected image of the reticle will coincide with a predetermined position on the wafer.

Further, the focus position along the Z axis on the wafer surface is measured by a focus-position detecting mechanism that includes a focus detecting optical system 564, and the position and angle of the wafer stage 562 are controlled. During exposure, therefore, the surface of the wafer is always maintained at the position at which the image is formed by the projection optical system.

When one scanning exposure of the wafer ends, the wafer stage 562 is stepped in the X and/or Y directions to move the stage to the starting position of the next scanning exposure, then the reticle stage 552 and wafer stage 562 are again scanned synchronously in the X direction at a speed ratio that is proportional to the magnification of the projection optical system.

Thus, an operation for synchronously scanning the reticle and wafer in a state in which the demagnified projection image of the reticle is formed on the wafer is repeated (by a step-and-scan operation). The transfer pattern of the reticle is thus transferred to the entire surface of the wafer.

In the conventional EUV exposure apparatus, the following problems arise in a case where consideration is given to TTL (Through-the-Lens) alignment in which the relative positioning (referred to as alignment below) between a reticle and a wafer is carried out via a reflecting-type reticle and multilayer mirrors using non-exposing light:

Since the reflecting-type reticle and multilayer mirrors are optimized to obtain a high reflectivity with EUV light, sufficient reflectivity is not obtained with regard to alignment light that is non-exposing light, and it is conceivable that highly precise alignment will not be achieved. Accordingly, there is a need of an optical system in which satisfactory alignment signal light is obtained at all times in order to achieve alignment.

Furthermore, the alignment detecting optical system must take into consideration space-relation limitations. For example, the exposing light must not be blocked when alignment detection is not carried out. As a consequence, a limitation is imposed upon the structures of the detection system and detection optical system.

In the ordinary projection exposure apparatus, a method of aligning the reticle and wafer via a projection lens is referred to as TTL alignment. In an EUV exposure apparatus, however, the projection optical system is constituted not by lenses but by the multilayer-mirror optical system. It is difficult to refer to this scheme as a TTL scheme. However, for the sake of simplifying the description, an alignment system that uses the intervention of a multilayer-mirror optical system will also be defined as being a TTL alignment scheme in this specification.

SUMMARY OF THE INVENTION

Accordingly, an object of the present invention is to prevent a decline in the amount of light of an alignment signal and to make it possible to construct a highly precise alignment detecting optical system.

Another object of the present invention is to mitigate limitations relating to the structure of the detecting system and detection optical system.

According to one aspect of the present invention, a method of detecting relative position of a reflecting-type reticle and substrate, the reticle having an alignment mark thereon is provided. The method comprises: a holding step of holding the reticle on a reticle stage which has a reference mark; and a first detection step of detecting relative position of the reference mark of the reticle stage, and the alignment mark on the reticle.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

In the description that follows, it is assumed that the exposure apparatus is an EUV exposure apparatus that employs a projection optical system using a multilayer reflecting mirror. However, the present invention is not limited to this arrangement. For example, the invention is applicable to an exposure apparatus that employs a projection optical system using a lens, and to a proximity exposure apparatus (typified by an X-ray exposure apparatus).

[First Embodiment]

Figure 1:
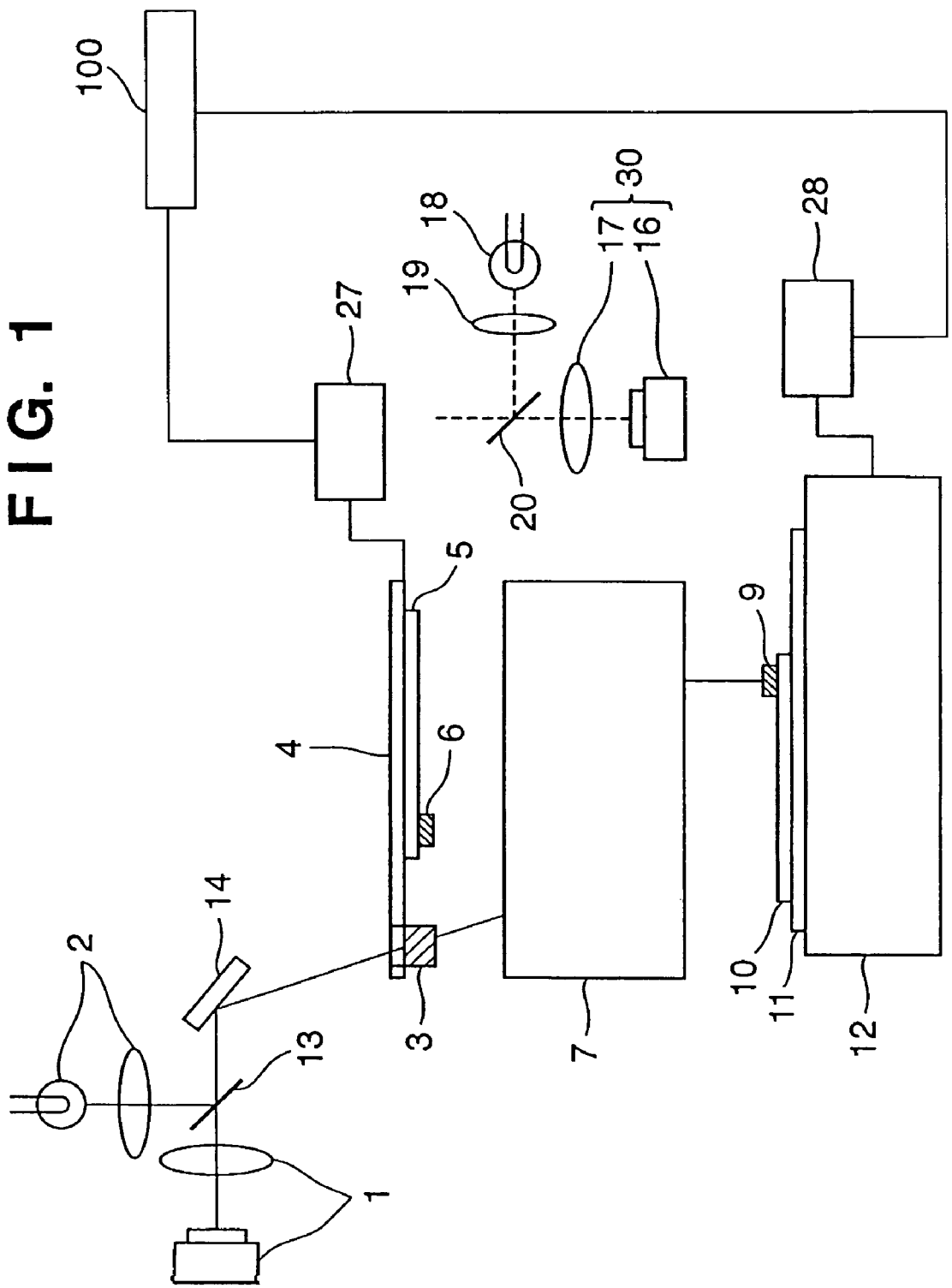
FIG. 1 is a schematic view illustrating a semiconductor exposure apparatus that includes a position detecting apparatus according to a first embodiment of the present invention.
Figure 2:
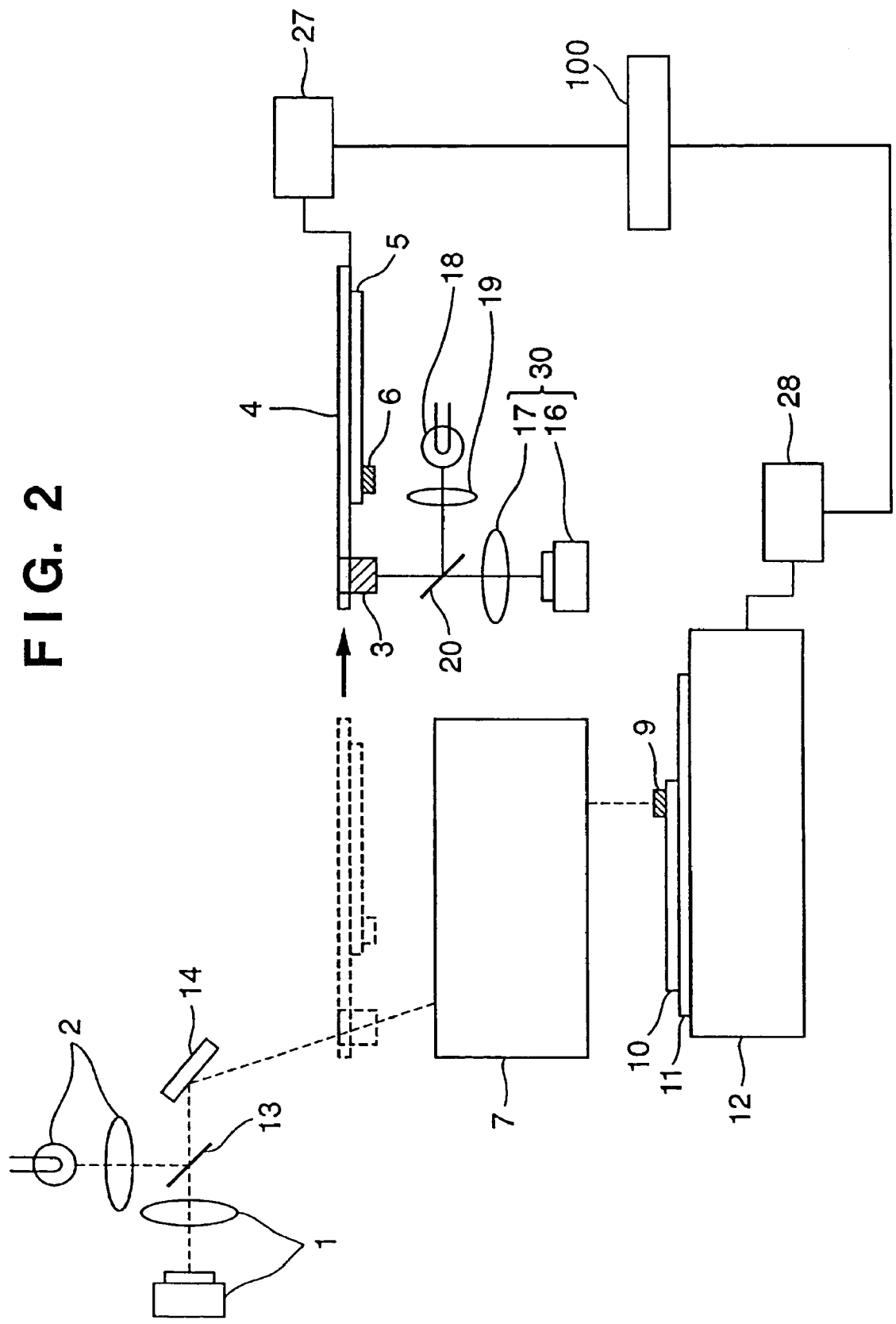
FIG. 2 is a schematic view illustrating a semiconductor exposure apparatus that includes a position detecting apparatus according to the first embodiment.

FIGS. 1 and 2 are schematic views illustrating a semiconductor exposure apparatus that includes a position detecting apparatus according to a first embodiment of the invention. The alignment mechanism of the semiconductor exposure apparatus according to the first embodiment, as well as the operation of this mechanism, will be described with reference to FIGS. 1 and 2.

As shown in FIG. 1, an illuminating optical system 2 comprises a light source, which emits non-exposing light, and illuminating optics. The illuminating light from the illuminating optical system 2 is reflected by a half-mirror 13 and mirror 14 so as to illuminate a transmitting-type alignment mark (referred to as a reticle-stage reference mark) 3 disposed on a reticle stage 4 through a transparent portion or an aperture of the reticle stage 4. It should be noted that a portion of the reticle-stage reference mark 3 is transmissive with respect to the wavelength of the non-exposing light from the illuminating optical system 2. Preferably, the reticle-stage reference mark 3 is constituted by a substrate having optimum transmittance with respect to the alignment light and an opaque pattern thereon.

Figure 9:
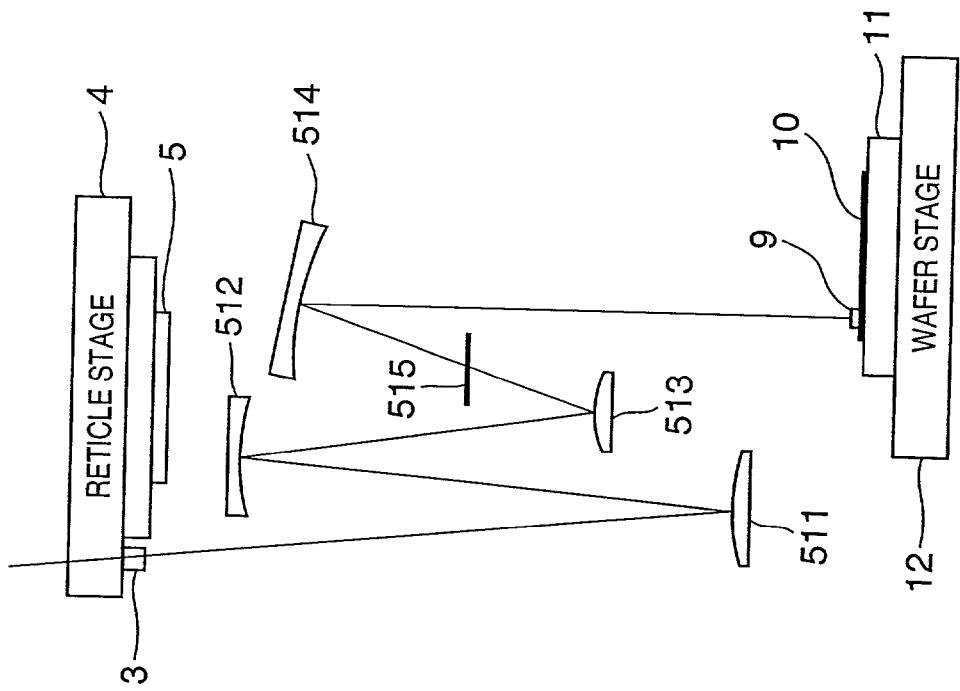
FIG. 9 is a diagram illustrating the path of alignment light in a reflecting optical system.

The illuminating light that has passed through the reticle-stage reference mark 3 passes through a multilayer-mirror optical system 7 and illuminates a wafer alignment mark 9 on a wafer 10. FIG. 9 illustrates the path of the alignment light.

Figure 5:
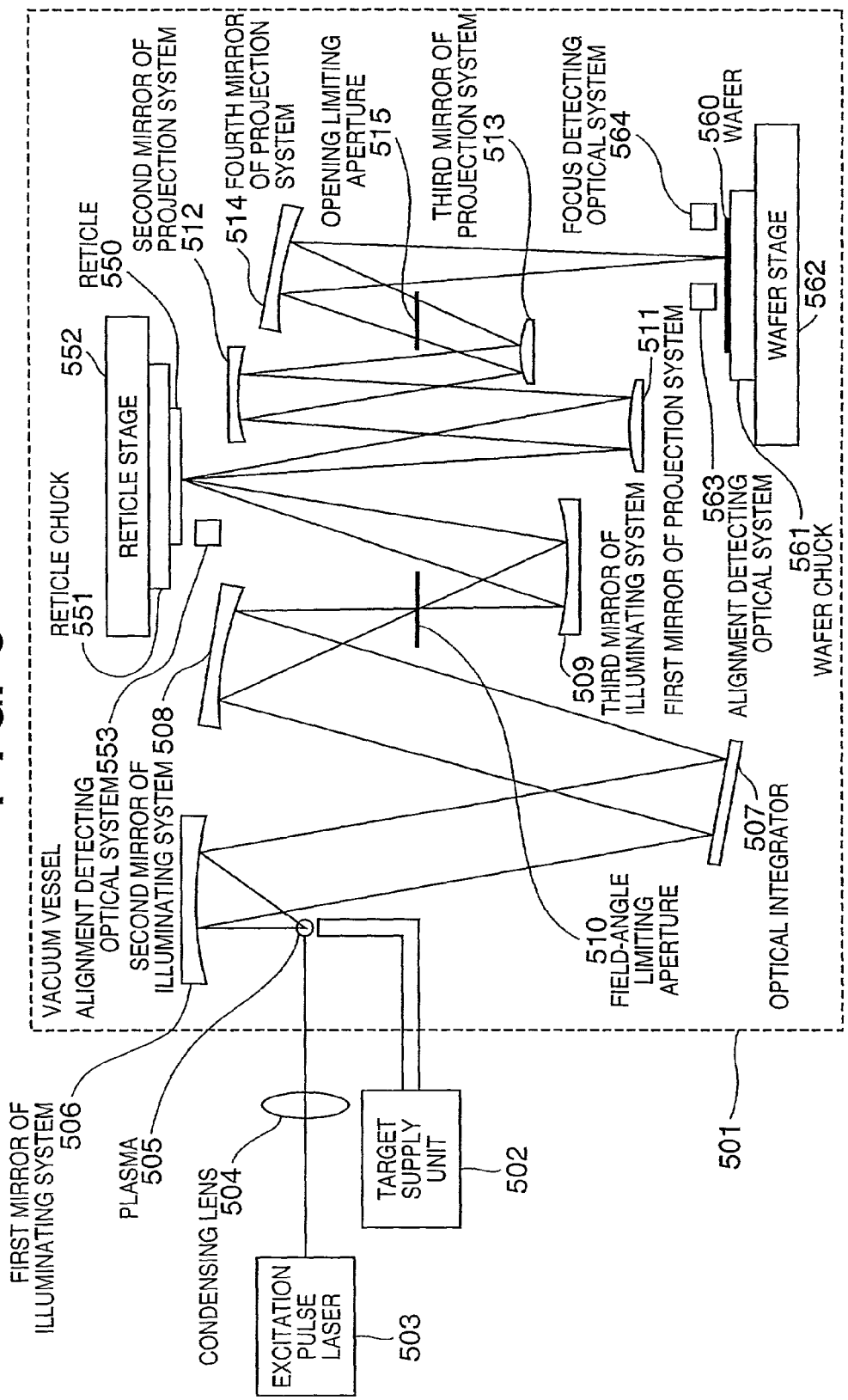
FIG. 5 is a schematic view illustrating a demagnifying projection exposure apparatus using EUV light.

The apparatus includes the first through fourth mirrors 511 to 514, respectively, of the projection system described above with reference to FIG. 5, and an opening limiting aperture 515. As will be understood from FIG. 9, the reticle-stage reference mark 3 through which the alignment light (non-exposing light) passes is provided, as a result of which the alignment light arrives at a wafer alignment mark 9 by traversing only the projection optical system.

The images of the reticle-stage reference mark 3 and wafer alignment mark 9 illuminated by the illuminating optical system 2 are detected by an alignment detecting optical system 1 comprising an image forming lens and an image sensing device, and relative positioning of the reticle-stage reference mark 4 and wafer alignment mark 9 is carried out by an image processing detection method. Image processing detection methods that can be mentioned are template matching, symmetrical pattern matching and centroid-position detection.

The relative positional relationship between the reticle-stage reference mark 3 and a reticle alignment mark 6 is detected beforehand, by a method described in FIG. 2, using an optical system indicated at reference numerals 16 to 20 and 30, and the relationship is stored by a storage device 27 for storing the position of the reticle stage. Accordingly, if relative positioning of the reticle-stage reference mark 4 and wafer alignment mark 9 is performed, then positioning of the reticle 5 and wafer 10 can be carried out. It should be noted that the wafer 10 is held by a wafer chuck 11 and mounted on a wafer stage 12.

FIG. 2 is a diagram illustrating a method of detecting the relative positions of the reticle-stage reference mark placed on the reticle stage 4 and the reticle alignment mark 6 placed on the reticle 5. Image processing and detection are executed by a detecting optical system 30 comprising an image sensing unit 16 and an image forming optical system 17, and the relative positional relationship between the reticle-stage reference mark 3 and the reticle alignment mark 6 is detected. The mechanism (the components indicated by the reference numerals 16 to 20 and 30), which detects the relative position of the reticle-stage reference mark and reticle alignment mark, shall be referred to as a first detection mechanism.

More specifically, first the reticle stage 4 is moved to the detection position of the detecting optical system 30. The position of the reticle-stage reference mark 3 is detected by the detecting optical system 30 and the position of the reticle stage at this time is stored by the storage unit 27. It should be noted that the reticle-stage reference mark of this embodiment is obtained by placing a reticle-stage reference mark comprising an object through which alignment light does not pass on an object (membrane) through which the alignment light does pass. The reticle-stage alignment mark can be detected by the detecting optical system 30. Next, the reticle stage 4 is moved, the position of the reticle alignment mark 6 on the reticle 5 is subjected to image processing and detection by the detecting optical system 30, and the position of the reticle stage 4 at this time is stored by the storage unit 27. The coordinates of the reticle stage 4 when each mark is detected by the detecting optical system 30 are thus stored in the storage unit 27. The relative position of the reticle-stage reference mark 3 and reticle alignment mark 6 is detected from these coordinates.

It should be noted that the detecting optical system 30, a light source 18, an illuminating optical system 19 and half-mirror 20 may have moving mechanisms. When detection of alignment is not carried out, there is a possibility that the optical system constituted by the detecting optical system 30, light source 18, illuminating optical system 19 and half-mirror 20 will interfere with the operation of other units, as by blocking the exposing light within the exposure apparatus. Hence it is made possible to retract this optical system to a position at which it will not interference with other units.

Figure 10:
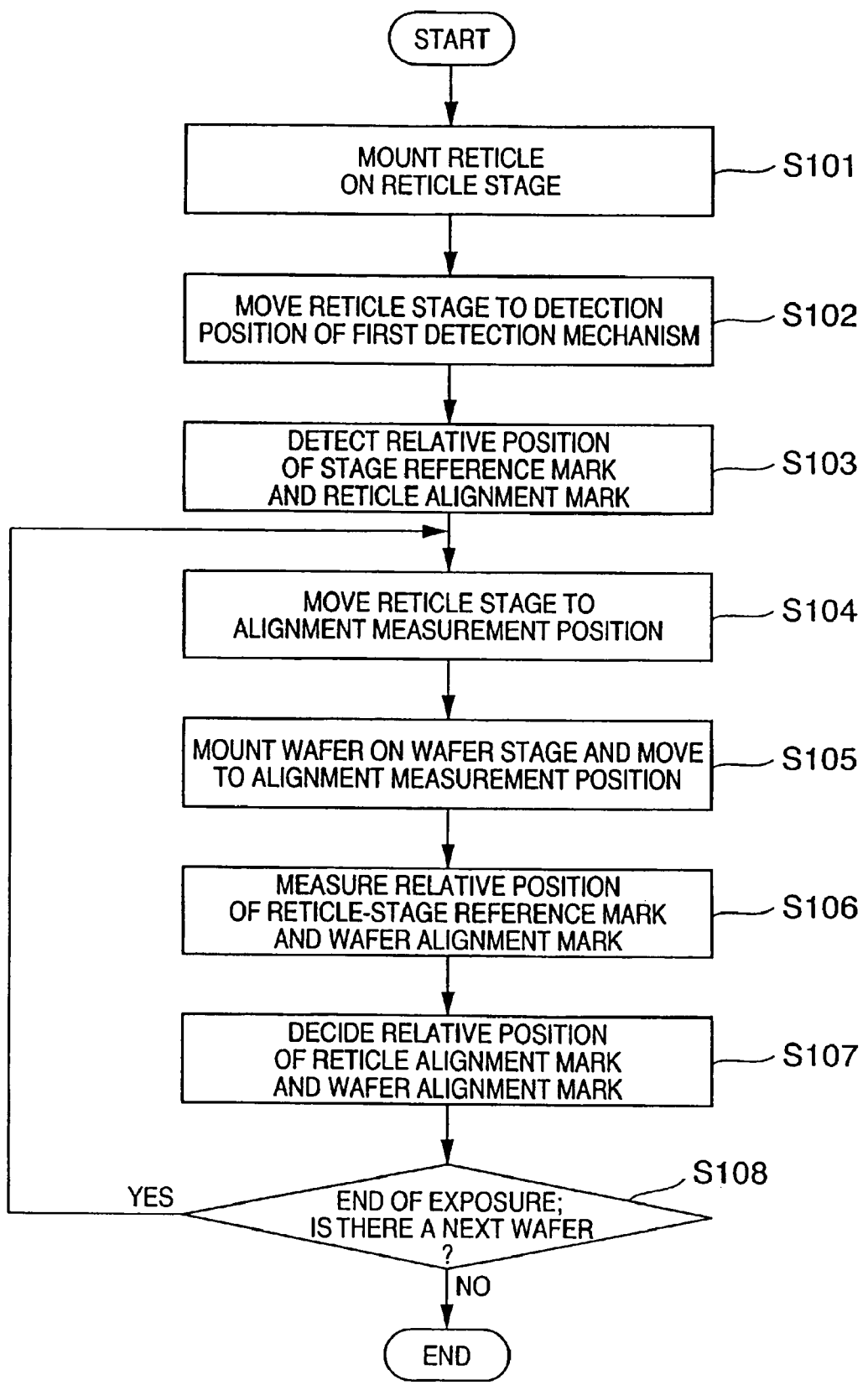
FIG. 10 is a flowchart useful in describing a procedure for measuring alignment according to the first embodiment.

FIG. 10 is a flowchart useful in describing the procedure of alignment processing executed according to the first embodiment set forth above. It should be noted that the procedure for alignment treatment shown in FIG. 10 is implemented by a control system (not shown) provided on the above-described exposure apparatus.

When the reticle 5 is mounted on the reticle stage 4 (S101), the reticle stage 4 is moved to a position at which relative position is detected by a first detection mechanism (S102). The first detection mechanism detects the relative position of the reticle-stage reference mark 3 and reticle alignment mark 6 (S103) through the procedure described above in connection with FIG. 2.

When measurement by the first detection mechanism ends, the reticle stage 4 is moved to an alignment measurement position in order to measure alignment (S104). At this position the alignment light from the illuminating optical system 2 shown in FIG. 1 passes through the reticle-stage reference mark 3 and impinges upon the multilayer-mirror optical system 7. Meanwhile, the wafer stage 12 on which the wafer 10 has been mounted also is moved to the alignment measurement position (S105). Under these conditions, the alignment light that has passed through the reticle reference mark illuminates the wafer alignment mark 9. The alignment detecting optical system 1 detects the light reflected from the wafer alignment mark 9 and measures the relative position of the reticle-stage reference mark 3 and wafer alignment mark 9 (S106).

Figure 3:
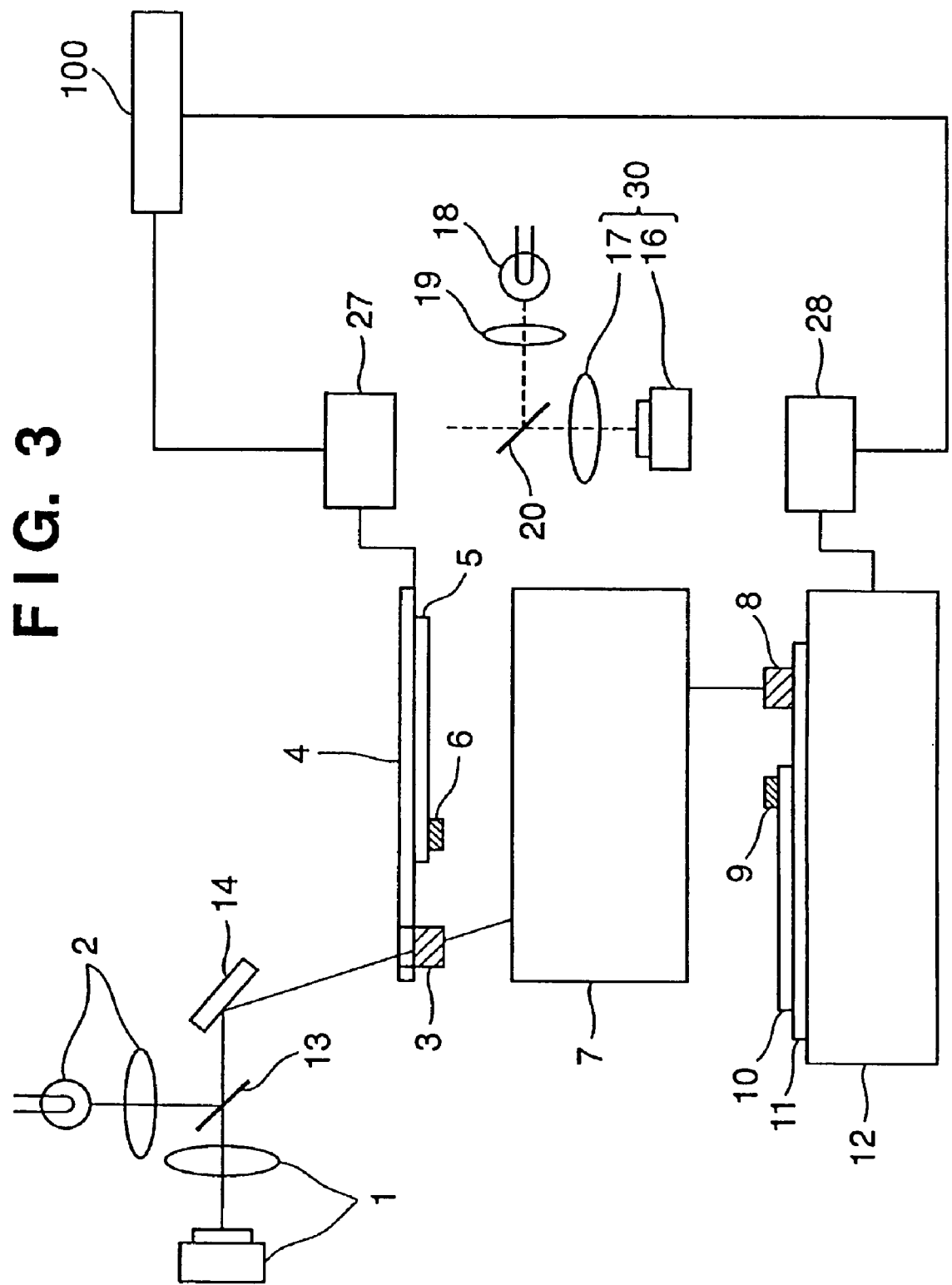
FIG. 3 is a schematic view illustrating a semiconductor exposure apparatus that includes a position detecting apparatus according to a second embodiment of the present invention.

From the thus obtained relative position (S103) of the reticle-stage reference mark 3 and reticle alignment mark 6 and relative position (S106) of the reticle-stage reference mark 3 and wafer alignment mark 9, the relative position of the reticle alignment mark 6 and wafer alignment mark 9 is decided (S107), and implemented using control system 100 as shown in each of FIGS. 1–3, thereby completing alignment measurement.

This ends one series of exposure processing steps. If there is a next wafer, then the processing from steps S104 onward is repeated with regard to this new wafer (S108).

When the relative positional relationship between the reticle-stage reference mark 3 and reticle alignment mark 6 is detected, the height between the two marks may be detected by detecting the defocusing characteristic of the images obtained. The detected value is used to adjust the positions of the reticle and wafer along the height direction at the time of exposure.

In accordance with the first embodiment, as described above, (1) the reticle-stage reference mark 3 having a portion through which non-exposing light is transmitted is provided; (2) the relative position of the reticle alignment mark 6 and reticle-stage reference mark 3 is detected by the detection system (16–19, 30) provided separately of the projection optical system; and (3) it is possible to perform alignment measurement using alignment light that has passed through the reticle-stage reference mark 3.

[Second Embodiment]

Figure 4:
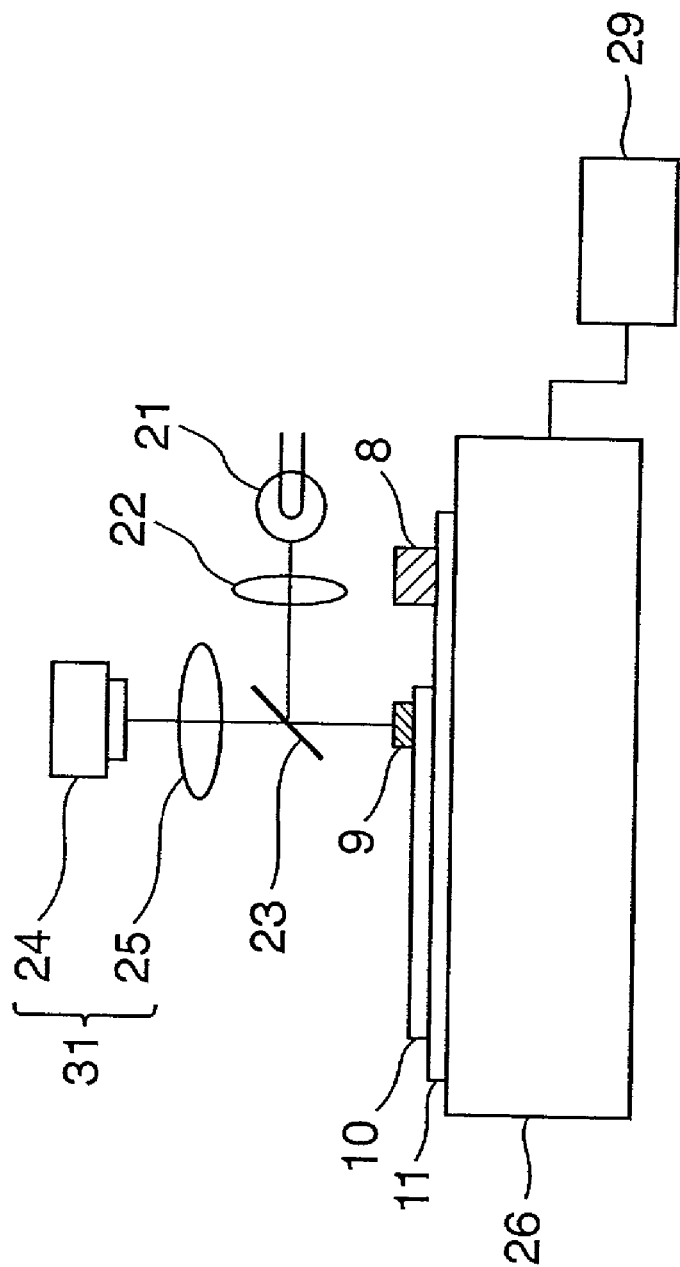
FIG. 4 is a schematic view illustrating a semiconductor exposure apparatus that includes a position detecting apparatus according to the second embodiment.

FIGS. 3 and 4 are schematic views illustrating a semiconductor exposure apparatus that includes a position detecting apparatus according to a second embodiment of the invention. In the first embodiment, alignment is carried out by illuminating the wafer alignment mark 9 with non-exposing light that has passed through the reticle-stage reference mark 3. In the second embodiment, alignment is carried out by illuminating a chuck mark 8, which is provided on the wafer chuck 11, with non-exposing light that has passed through the reticle-stage reference mark 3.

As shown in FIG. 3, the illuminating optical system 2 comprises a light source, which emits non-exposing light, and illuminating optics. The illuminating light from the illuminating optical system 2 is reflected by the half-mirror 13 and mirror 14 so as to illuminate the reticle-stage reference mark 3 disposed on the reticle stage 4 through the transparent portion or the aperture of the reticle stage 4. The illuminating light that has passed through the reticle-stage reference mark 3 passes through the multilayer-mirror optical system 7 and illuminates the chuck mark 8 disposed on the wafer chuck 11.

The images of the reticle-stage reference mark 3 and chuck mark 8 illuminated by the illuminating optical system 2 are detected by the alignment detecting optical system 1 comprising an image forming lens and an image sensing device, and relative positioning of the reticle-stage reference mark 4 and chuck mark 8 is carried out by an image processing detection method. The relative positional relationship between the reticle-stage reference mark 3 and reticle alignment mark 6, as well as the relative positional relationship between the chuck mark 8 and wafer alignment mark 9, is detected beforehand, by a method described later, whereby the relative position of the reticle-stage reference mark 3 and wafer alignment mark 9 is detected so that the reticle 5 and wafer 10 can be positioned relative to each other.

Described next will be a method of detecting the relative positional relationship between the reticle-stage reference mark 3 and reticle alignment mark 6 and the relative positional relationship between the chuck mark 8 and wafer alignment mark 9.

Through a method similar to that described above in connection with FIG. 2, the relative positional relationship between the reticle-stage reference mark 3 and reticle alignment mark 6 is found by executing image processing and detection using the detection mechanism comprising the detecting optical system 30, light source 18, illuminating optical system 19 and half-mirror 20, and storing the coordinates of the positions of the marks in the storage unit 27 for storing the position of the reticle stage.

The method of detecting the relative positional relationship between the chuck mark 8 and wafer alignment mark 9 will be described next with reference to FIG. 4.

This method is disclosed in Japanese Patent Application Laid-Open No. 61-263127 filed by the present applicant. According to this method, the relative positional relationship between the chuck mark 8 and wafer alignment mark 9 is detected before the wafer chuck 11 is mounted on the wafer stage 12, which is for being exposed by the exposure apparatus. As shown in FIG. 4, image processing and detection are executed by a detecting optical system 31, which comprises an image sensing device 24 and an image forming optical system 25, disposed externally of the exposure apparatus, and the relative positional relationship between the chuck mark 8 and wafer alignment mark 9 is detected. This detection system (the components indicated by the reference numerals 21 to 25 and 31) shall be referred to as a second detection mechanism.

The detection method includes first using the detecting optical system 31 to detect the position of the chuck mark 8 disposed on a moving stage 26 and storing the position of the moving stage 26 at this time in a storage unit 29 for storing stage position. Next, the moving stage 26 is moved, the position of the wafer alignment mark 9 on the wafer 10 is subjected to image processing and detection by the detecting optical system 31, and the position of the moving stage 26 at this time is stored by the storage unit 29. The relative position of the chuck mark 8 and wafer alignment mark 9 is detected from the coordinates, thus stored in the storage unit 29, of the moving stage 26 when each of the marks is detected by the detecting optical system 31.

Next, with the wafer 10 being held by the wafer chuck 11 carrying the chuck mark 8 (the condition in which measurement was carried out by the method shown in FIG. 4), as shown in FIG. 3, the chuck and wafer are transported and placed on the wafer stage, which is for being exposed by the exposure apparatus. The relative positional relationship between the reticle-stage reference mark 3 and chuck mark 8 is then detected, as described in connection with FIG. 3, and the wafer stage 12 is driven based upon the information concerning the relative positional relationship between the chuck mark 8 and wafer alignment mark 9, thereby performing exposure.

The processing for the above operation will now be described with reference to the flowchart of FIG. 11. The processing described below is implemented by a control system (not shown) provided on the above-described exposure apparatus.

When a new reticle is mounted, the relative position of the reticle-stage reference mark 3 and reticle alignment mark 6 is detected (S209) by executing the steps S101 to S103 in FIG. 10.

In a case wherein a new wafer is mounted, on the other hand, first, the wafer chuck 11 is mounted on the moving stage 26 and the wafer 10 is mounted on the wafer chuck 11 (S201). The wafer 10 is then moved to the position at which detection is performed by the second detection mechanism (S202), and the relative position of the chuck mark 8 and wafer alignment mark 9 is detected by the second detection mechanism (S203). The wafer chuck 11 holding the wafer 10 is then moved onto the wafer stage 12 (S204) and alignment measurement is carried out.

In alignment measurement, the wafer stage 12 and reticle stage 4 are moved to the position for alignment measurement (S205), and the relative position of the reticle-stage reference mark 3 and chuck mark 8 is detected by the illuminating optical system 2 and alignment detecting optical system 1 (S206). Next, the relative position of the reticle alignment mark 6 and wafer alignment mark 9, namely the relative position of the reticle and wafer, is decided (S207) based upon the relative position of the reticle-stage reference mark 3 and reticle alignment mark 6 detected at step S109, the relative position of the wafer alignment mark 9 and chuck mark 8 detected at step S203, and the relative position of the reticle-stage reference mark 3 and chuck mark 8 measured at step S206.

This ends one series of exposure processing steps. If there is a next wafer, then the processing from steps S201 onward is repeated with regard to this new wafer (S208).

Thus, according to the first and second embodiments, the relative position of the reticle-stage reference mark 3 and chuck mark 8 is detected by an on-axis TTL alignment optical system. According to this method, alignment measurement and exposure are, broadly speaking, carried out in parallel and the structural restrictions on the alignment detection system (restrictions imposed by the projection optical system in many cases) are eliminated. With regard to designing the alignment detection system, therefore, it is unnecessary to take space into consideration (within certain limits, of course), the detection mechanism and the like can be arranged with the highest priority being given to detection precision, and it becomes possible to construct various alignment detection systems. Further, stabilized detection rate and high precision can be achieved with a high throughput for a variety of wafer processes. Further, since the detection system for measuring the relationship between the reticle-stage reference mark and chuck mark in the exposure apparatus is an on-axis TTL alignment optical system, there is also no base line. (A base line is generated when off-axis alignment is performed. Hence there is a discrepancy between the position of the wafer stage when alignment is performed by an off-axis alignment scope and the position of the wafer stage when exposure is performed. This discrepancy is eliminated.) This makes it possible to eliminate a cause of poor measurement precision.

Further, when the relative positional relationship between the chuck mark 8 and wafer alignment mark 9 is detected, the height between the two marks can also be detected by detecting the defocusing characteristics of the images obtained.

When positioning the wafer 10 relative to the reticle 5 in the second embodiment, whether to use the chuck mark 8 or the wafer alignment mark 9 as the alignment mark on the wafer side may be decided by detecting the image of the wafer alignment mark 9 using a send-a-head wafer, etc. According to measuring using a send-a-head wafer, when a wafer is exposed by the exposure apparatus, measurement of various parameters (e.g., verification of alignment signal level) for the exposure apparatus, which are necessary when actual exposure is carried out, is performed before the actual exposure operation using a wafer employed in actual exposure or a wafer equivalent thereto. If the S/N ratio or contrast of the image signal from the wafer alignment mark 9 is a level that satisfies the specifications for alignment measurement, the detection method illustrated in the first embodiment is adopted. If the S/N ratio or contrast of this image signal is a level that does not satisfy the specifications, then measurement should be performed using the detection method described in the second embodiment (FIG. 11).

Figure 8:
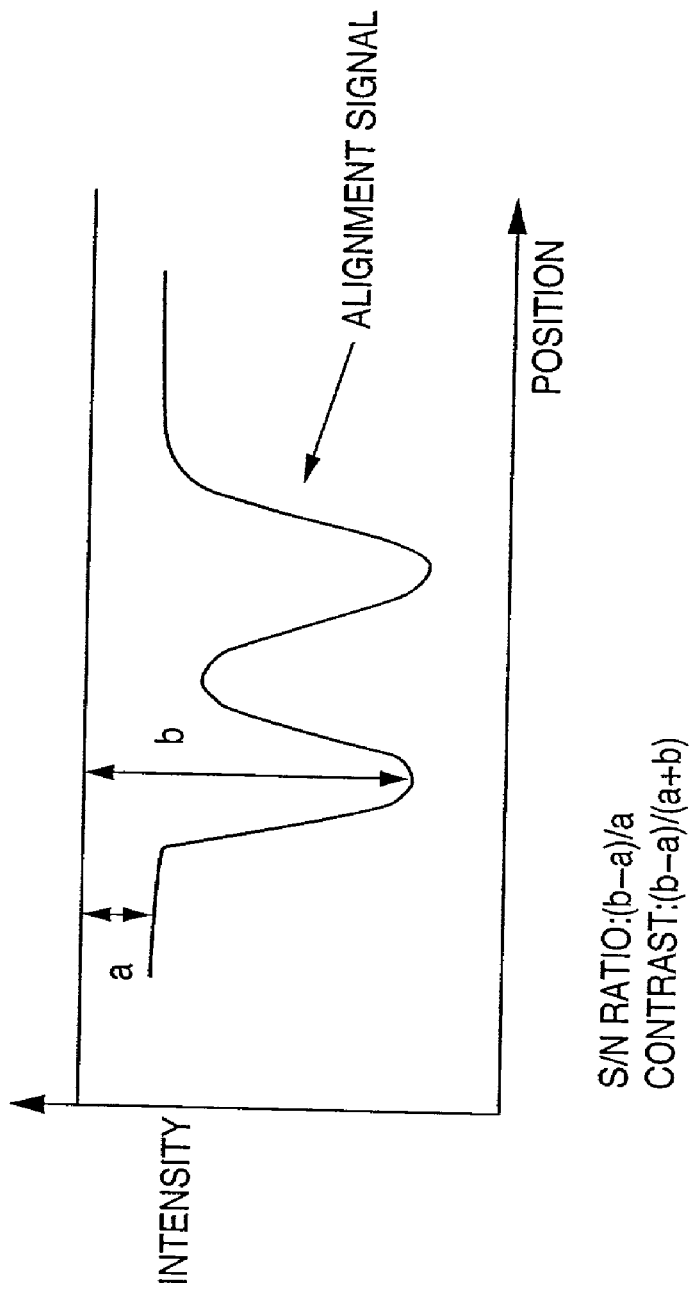
FIG. 8 is a diagram useful in describing detection of contrast and S/N ratio of a video signal (alignment signal)

The contrast of the image signal (alignment signal) can be found from (b−a)/(a+b) in FIG. 8, for example, and the S/N ratio can be found from (b−a)/a.

Figure 12:
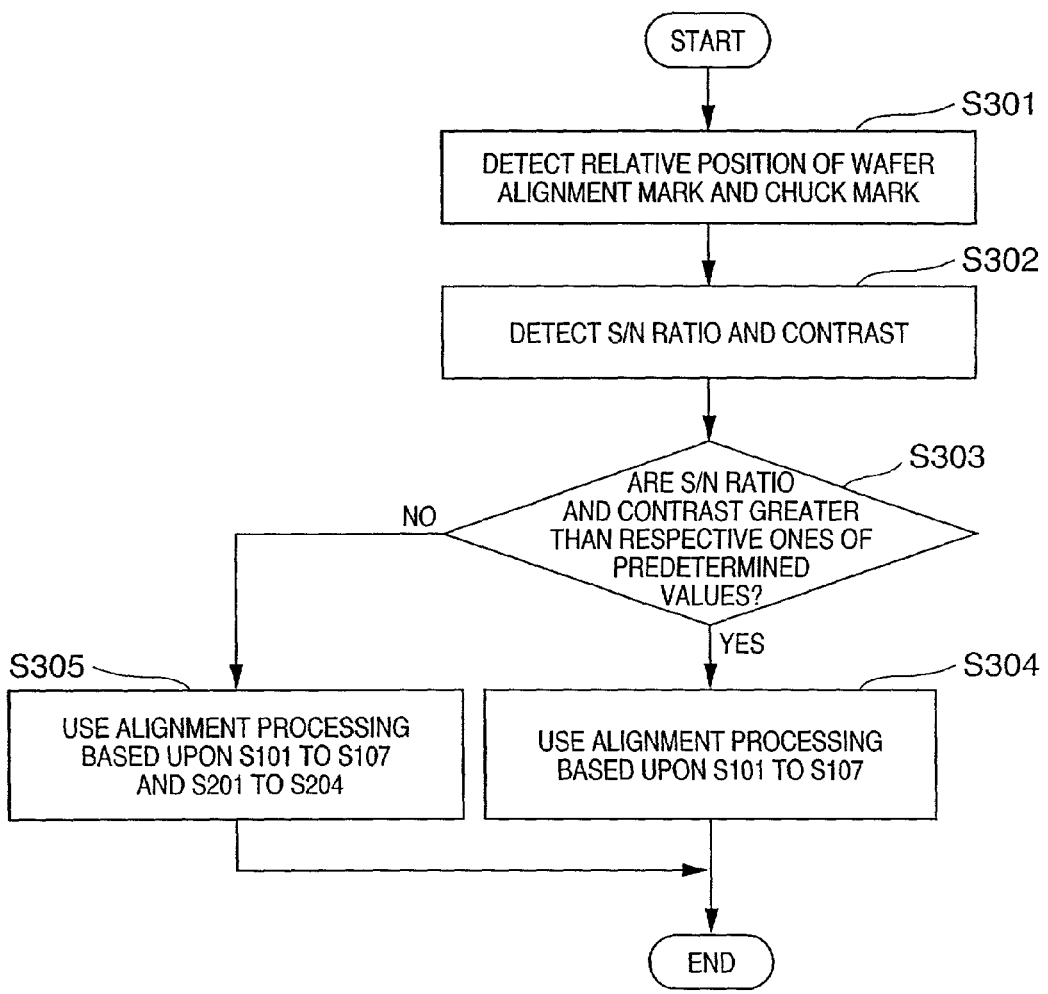
FIG. 12 is a flowchart useful in describing a procedure for selecting alignment procedures according to the first and second embodiments.

The above processing will be described with reference to the flowchart of FIG. 12.

Figure 11:
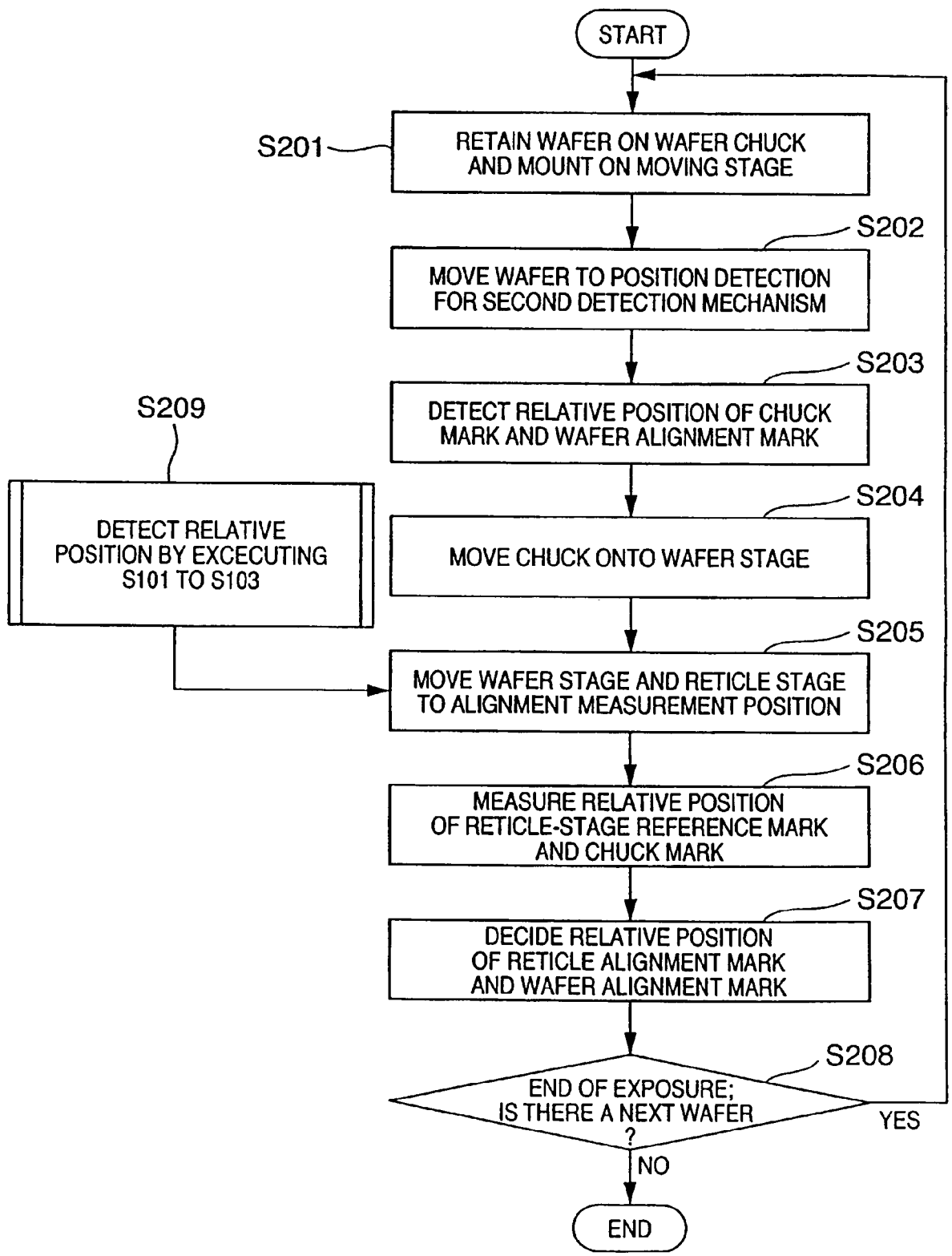
FIG. 11 is a flowchart useful in describing a procedure for measuring alignment according to the second embodiment.

First, through the procedure described at steps S101 to S107 in FIG. 10 and S201 to S204 in FIG. 11, i.e., by the method using the first and second detection mechanisms, the relative position of the wafer alignment mark and reticle alignment mark in the send-a-head wafer scheme is measured (S301). The S/N ratio and contrast are detected with regard to the image signal representing the wafer alignment mark obtained by this measurement (S302).

In a case wherein the S/N ratio and contrast exceed respective ones of predetermined values that have been set for them ("YES" at step S303), the wafer alignment mark can be used directly when alignment measurement is performed. Control, therefore, proceeds to step S304, wherein the apparatus is set for carrying out alignment measurement described in the first embodiment. On the other hand, if at least one of the S/N ratio and contrast falls below the predetermined value that has been set for it ("NO" at step S303), then it is preferred that alignment measurement be carried out using the chuck mark 8. Thus, the apparatus is set (S305) in such a manner that alignment measurement described in the second embodiment is executed.

Figure 6:
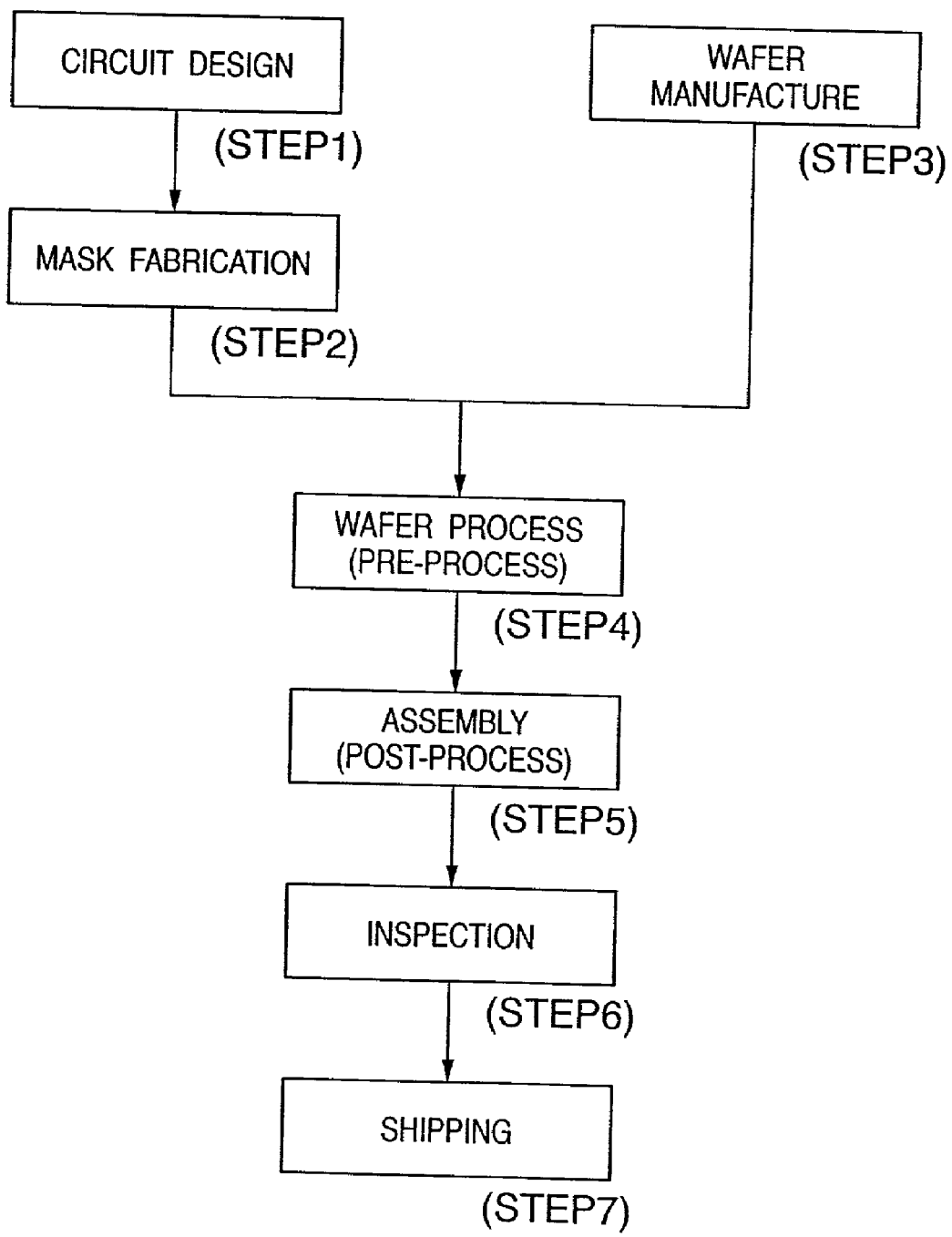
FIG. 6 is a diagram useful in describing the flow of a device manufacturing process.

A process for manufacturing a semiconductor device utilizing the exposure apparatus set forth above will now be described. FIG. 6 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and a durability test at step 6 (inspection). The semiconductor device is completed through these steps and then is shipped (step 7). The pre- and post-treatments are performed at separate special-purpose plants. Maintenance is carried out on a pre-plant basis by the above-described remote maintenance system. Further, information for production management and equipment maintenance is communicated by data communication between the pre- and post-treatment plants via the Internet or leased-line network.

Figure 7:
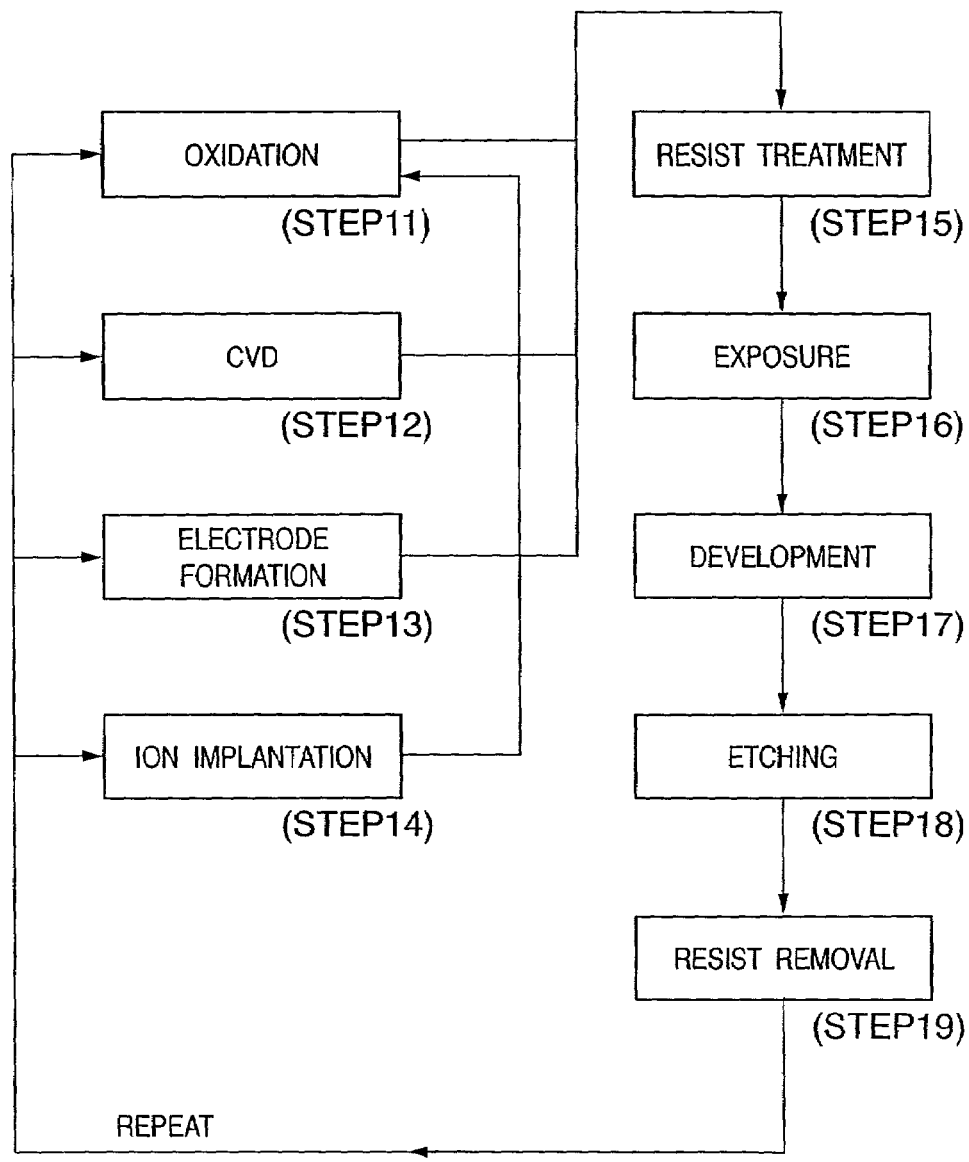
FIG. 7 is a diagram useful in describing a wafer process.

FIG. 7 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mask to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

Thus, in accordance with the embodiments as described above, in an EUV exposure apparatus, for example, transmittance or reflectivity for alignment light can be optimized for relative positioning of a reflecting-type reticle and wafer, and it is possible to obtain an alignment signal of excellent S/N ratio or contrast by using a reticle-stage reference mark, which has been disposed on a reticle stage, as an alignment mark. This makes highly precise alignment feasible. Especially good effects are obtained when position detection is performed by a TTL scheme. Furthermore, by adopting a reticle-stage reference mark that transmits light, an alignment detecting optical system can be situated above the reticle stage, as shown in FIG. 1. As a result, the exposing light is no longer blocked, there is a greater degree of freedom in terms of laying out the alignment detecting optical system, and measurement can be carried out without interfering with the exposing light.

Thus, in accordance with the invention as described above, it is possible to prevent a decline in the amount of light of an alignment signal and to construct a highly precise alignment detecting optical system.

As many apparently widely different embodiments of the present invention can be made without departing from the spirit and scope thereof, it is to be understood that the invention is not limited to the specific embodiments thereof except as defined in the appended claims.

What is claimed is:

1. A method of determining relative position between a reflective reticle and a substrate, said method comprising:
   a first detection step of detecting relative position between a transmissive reference mark on a reticle stage and a substrate alignment mark through a reflective optical system which projects a pattern of the reflective reticle onto the substrate with extreme ultraviolet light;
   a second detection step of detecting relative position between a reflective reference mark on the reticle stage and a reflective alignment mark on the reticle, said second detection step comprising steps of:
   (i) detecting light reflected from the reflective reference mark with a detector,
   (ii) detecting light reflected from the reflective alignment mark with the detector, and
   (iii) changing relative position between the reticle stage and the detector between said step (i) and said step (ii); and
   a determination step of determining relative position between the reticle and the substrate based on the detection results in said first and second detection steps.

2. A method according to claim 1, wherein the substrate alignment mark used in said first detection step is one of a substrate mark formed on the substrate and a chuck mark formed on a chuck which holds the substrate.

3. A method according to claim 2, wherein the substrate alignment mark used in said first detection step is selected from the substrate mark and the chuck mark based on a signal obtained by detecting the substrate mark.

4. A method according to claim 1, wherein, in said determination step, the relative position between the reticle and the substrate is determined based on the relative position between the transmissive reference mark on the reticle stage and the substrate alignment mark and the relative position between the reflective reference mark on the reticle stage and the reflective alignment mark on the reticle.

5. A method according to claim 4, wherein, in said determination step, the relative position between the reticle and the substrate is determined based on the relative position between the transmissive reference mark on the reticle stage and the chuck mark, the relative position between the reflective reference mark on the reticle stage and the reflective alignment mark on the reticle and the relative position between the chuck mark and the substrate mark formed on the substrate.

6. A method according to claim 1, wherein the substrate alignment mark used in said first detection step is a chuck mark formed on a chuck which holds the substrate, said method further comprising a third detection step of detecting relative position between the chuck mark and a substrate mark formed on the substrate.

7. An apparatus for determining relative position between a reflective reticle and a substrate, said apparatus comprising:
   a first detection system which detects relative position between a transmissive reference mark on a reticle stage and a substrate alignment mark through a reflective optical system which projects a pattern of the reflective reticle onto the substrate with extreme ultraviolet light;

a second detection system which has a sensor and detects relative position between a reflective reference mark on the reticle stage and a reflective alignment mark on the reticle, wherein the reflective reference mark and the reflective alignment mark are detected at respective relative positions between said sensor and said reticle stage; and a determination unit which determines relative position between the reticle and the substrate based on the detection results of said first and second detection systems.

8. An apparatus according to claim 7, wherein the substrate alignment mark detected by said first detection system is one of a substrate mark formed on the substrate and a chuck mark formed on a chuck which holds the substrate.

9. An apparatus according to claim 8, wherein the substrate alignment mark detected by said first detection system is selected from the substrate mark and the chuck mark based on a signal obtained by detecting the substrate mark.

10. An apparatus according to claim 7, wherein the substrate alignment mark detected by said first detection system is a chuck mark formed on a chuck which holds the substrate, said apparatus further comprising a third detection system which detects relative position between the chuck mark and a substrate mark formed on the substrate.

11. An apparatus according to claim 10, wherein said determination unit determines the relative position between the reticle and the substrate based on the relative position between the transmissive reference mark on the reticle stage and the chuck mark, the relative position between the reflective reference mark on the reticle stage and the reflective alignment mark on the reticle and the relative position between the chuck mark and the substrate mark formed on the substrate.

12. An apparatus according to claim 7, wherein said determination unit determines the relative position between the reticle and the substrate based on the relative position between the transmissive reference mark on the reticle stage and the substrate alignment mark and the relative position between the reflective reference mark on the reticle stage and the reflective alignment mark on the reticle.

13. An exposure apparatus which has a reflective optical system and projects a pattern of a reflective reticle onto a substrate through the reflective optical system with extreme ultraviolet light, said apparatus comprising:

a position determination system which determines relative position between the reflective reticle and the substrate, said system comprising:

(i) a first detection system which detects relative position between a transmissive reference mark on a reticle stage and a substrate alignment mark through said reflective optical system; and (ii) a second detection system which has a sensor and detects relative position between a reflective reference mark on the reticle stage and a reflective alignment mark on the reticle, wherein the reflective reference mark and the reflective alignment mark are detected at respective relative positions between said sensor and said reticle stage.

14. A device manufacturing method comprising steps of:

projecting a pattern of a reflective reticle onto a substrate through a reflective optical system with extreme ultraviolet light, relative position between the reflective reticle and the substrate being determined by a relative position determining method, said relative position determining method comprising:

a first detection step of detecting relative position between a transmissive reference mark on a reticle stage and a substrate alignment mark through a reflective optical system which projects a pattern of the reflective reticle onto the substrate with extreme ultraviolet light;

a second detection step of detecting relative position between a reflective reference mark on the reticle stage and a reflective alignment mark on the reticle, said second detection step comprising steps of:

(i) detecting light reflected from the reflective reference mark with a detector, (ii) detecting light reflected from the reflective alignment mark with the detector, and (iii) changing relative position between the reticle stage and the detector between said step (i) and said step (ii); and a determination step of determining relative position between the reticle and the substrate based on the detection results in said first and second detection steps; and developing the substrate onto which the pattern has been projected in said projecting step.

* * * * *

UNITED STATES PATENT AND TRADEMARK OFFICE
CERTIFICATE OF CORRECTION

PATENT NO. : 6,992,780 B2
APPLICATION NO. : 10/150154
DATED : January 31, 2006
INVENTOR(S) : Koichi Sentoku et al.

It is certified that error appears in the above-identified patent and that said Letters Patent is hereby corrected as shown below:

COLUMN 1:
Line 25, "excimer" should read -- excimer lasers and 193 nm in ArF excimer lasers. --.

COLUMN 7:
Line 2, "interference" should read -- interfere --.

COLUMN 10:
Line 26, "of alignment" should read -- of offset of an alignment detection value and verification of alignment --.

Signed and Sealed this

Twenty-second Day of August, 2006

JON W. DUDAS
*Director of the United States Patent and Trademark Office*